(12) United States Patent
Lee

(10) Patent No.: US 9,160,375 B2
(45) Date of Patent: Oct. 13, 2015

(54) APPARATUS AND METHOD FOR GAIN OF DRIVER AMPLIFIER EXPONENTIAL VARIABLE IN WIRELESS TRANSMITTER

(71) Applicant: Samsung Electronics Co. Ltd., Suwon-si, Gyeonggi-do (KR)

(72) Inventor: Jong-Woo Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 58 days.

(21) Appl. No.: 13/724,804

(22) Filed: Dec. 21, 2012

(65) Prior Publication Data

US 2013/0171949 A1 Jul. 4, 2013

(30) Foreign Application Priority Data

Dec. 28, 2011 (KR) .................. 10-2011-0144189

(51) Int. Cl.
| | |
|---|---|
| H04B 1/04 | (2006.01) |
| H03G 3/10 | (2006.01) |
| H03F 3/21 | (2006.01) |
| H03F 1/22 | (2006.01) |
| H03F 3/24 | (2006.01) |
| H03F 3/72 | (2006.01) |
| H03G 1/00 | (2006.01) |

(52) U.S. Cl.
CPC .................. *H04B 1/04* (2013.01); *H03F 1/223* (2013.01); *H03F 3/211* (2013.01); *H03F 3/245* (2013.01); *H03F 3/72* (2013.01); *H03G 1/0029* (2013.01); *H03F 2200/456* (2013.01); *H03F 2203/7206* (2013.01); *H03F 2203/7236* (2013.01)

(58) Field of Classification Search
USPC ......... 455/127.2, 127.3, 127.5; 330/277, 278, 330/310, 311
See application file for complete search history.

(56) References Cited

U.S. PATENT DOCUMENTS

| | | | |
|---|---|---|---|
| 5,880,631 A | 3/1999 | Sahota | |
| 6,724,235 B2 * | 4/2004 | Costa et al. | 327/378 |
| 7,126,428 B2 * | 10/2006 | Lin et al. | 330/311 |
| 7,199,661 B1 | 4/2007 | Shirvani-Mahdavi et al. | |
| 7,276,976 B2 * | 10/2007 | Oh et al. | 330/311 |
| 7,352,247 B2 * | 4/2008 | Oh et al. | 330/311 |
| 7,889,008 B2 * | 2/2011 | Lee et al. | 330/278 |
| 8,022,772 B2 * | 9/2011 | Cassia et al. | 330/311 |
| 8,330,547 B2 * | 12/2012 | Godbole | 330/311 |
| 2006/0119435 A1 | 6/2006 | Oh et al. | |

(Continued)

FOREIGN PATENT DOCUMENTS

| | | |
|---|---|---|
| EP | 0332367 B1 | 8/1996 |
| KR | 10-2012-0010378 A | 2/2012 |

OTHER PUBLICATIONS

H.Elwan et al.'Digitally controlled dB-linear CMOS variable gain amplifier.' In: IEEE Electronic Letters, Sep. 30, 1999, vol. 35, No. 20, pp. 1725-1727.

(Continued)

*Primary Examiner* — Blane J Jackson
(74) *Attorney, Agent, or Firm* — Jefferson IP Law, LLP

(57) ABSTRACT

An apparatus and a method for exponentially controlling a gain of a driver amplifier to drive a power amplifier are provided. The driver amplifier includes a plurality of cascode amplifier segments, wherein when a plurality of candidate gain values of the driver amplifier is arranged, the candidate gain values form a geometric sequence. A unit cost can be reduced by halving an area occupied by the driver amplifier.

10 Claims, 3 Drawing Sheets

(56) References Cited

U.S. PATENT DOCUMENTS

2010/0237945 A1 9/2010 Cassia et al.
2010/0308916 A1 12/2010 Lee et al.

OTHER PUBLICATIONS

Takafumi Yamaji et al. "Temperature-Stable CMOS Variable-Gain Amplifier With 80-d.B Linearly Controlled Gain Range." In: IEEE Journal of Solid-State Circuits, vol. 37, No. 5, May 2002, pp. 553-557.

Hui Dong Lee et al. 'A Wideband CMOS Variable Gain Amplifier With an Exponential Gain Control.' In: IEEE Transactions on Microwave Theory and Techniques, vol. 55, No. 6, Jun. 2007, pp. 1363-1373.

Arun Ravindran et al., A Differential CMOS Current-Mode Variable Gain Amplifier with Digital dB-Linear Gain Control, Analog Integrated Circuits and Signal Processing, Kluwer Academic Publishers, Feb. 1, 2004, vol. 38, No. 2-3, XP019203907, ISSN: 1573-1979, DOI: 10.1023/B:ALOG.0000011166.86883.A6.

* cited by examiner

APPARATUS AND METHOD FOR GAIN OF DRIVER AMPLIFIER EXPONENTIAL VARIABLE IN WIRELESS TRANSMITTER

PRIORITY

This application claims the benefit under 35 U.S.C. §119(a) of a Korean patent application filed on Dec. 28, 2011 in the Korean Intellectual Property Office and assigned Serial No. 10-2011-0144189, the entire disclosure of which is hereby incorporated by reference.

BACKGROUND OF THE INVENTION

1. Field of the Invention

The present invention relates to a variable amplifier for amplifying a Radio Frequency (RF) signal in a wireless transmitter. More particularly, the present invention relates to an apparatus and a method for exponentially controlling a gain of a driver amplifier to drive a power amplifier which provides a signal to an antenna stage.

2. Description of the Related Art

A general wireless transmitter uses a power amplifier for emitting an RF signal via an antenna. For example, the power amplifier is disposed at the end of a receiver and sends a signal with high power via the antenna.

However, such an amplifier structure is unable to obtain both a significant gain and a significant increase in power, and exhibits an increased performance only when focusing on either the gain or the power. More particularly, it is difficult for the power amplifier to produce a high power and satisfy a high gain at the same time. Yet, both high power and high gain are necessary for characteristics of the transmitter.

Thus, a separate high-gain amplifier is used in a front end to drive the power amplifier. An amplifier at the end of the transmitter combines a Driver Amplifier (DA) and a Power Amplifier (PA).

Typically, a structure of the DA is a set of cascode amplifiers to attain a variable gain. A cascode structure has good input/output isolation, high output impedance, and high gain. For example, for a variable gain interval of 6 dB, a unit cascode amplifier includes eight sets which increase by multiples of two, for example, 1, 2, 4, 8, 16, 32, 64, and 128, and only the cascode amplifier corresponding to the intended gain operates among the cascode amplifier sets.

However, eight digital switches are required to control six gain modes, which adopt a 3-to-8 decoder. Since only one cascode amplifier operates and other cascode amplifier sets do not operate in one mode, this process is inefficient. For example, the area 256 times the smallest unit cascode amplifier size is required for the 8-step gain control, which increases a unit cost.

In addition, scalability is greatly degraded. In some cases, a structure of the wireless transmitter may need more various gains. The control based on 3 dB or 1 dB, rather than 6 dB, is quite complicated and feasible only based on an approximate value, and thus its accuracy also degrades. When the control mode uses 16 steps or 32 steps, not 8 steps, a control switch exponentially increases as such and the area is two times the branch of a maximum gain. As a result, the inefficiency still remains.

Therefore, a need exists for an apparatus and a method for exponentially controlling a gain of a driver amplifier to drive a power amplifier which provides a signal to an antenna stage.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a driver amplifier using gain control which linearly responds to a dB unit which is given on a log scale.

Another aspect of the present invention is to provide a control switch and a driver amplifier for setting a variable gain so that a user can intuitively perceive the variable gain using a control code.

Yet another aspect of the present invention is to provide a variable transistor circuit for exponentially increasing a gain as a control code increases.

According to one aspect of the present invention, a driver amplifier is provided. The driver amplifier includes a plurality of cascode amplifier segments. When a plurality of candidate gain values of the driver amplifier is arranged, the candidate gain values form a geometric sequence.

According to another aspect of the present invention, a transmitter is provided. The transmitter includes a Digital to Analog Converter (DAC) for converting a digital signal to an analog signal, a Low Pass Filter (LPF) for removing a high frequency noise from an analog output signal of the DAC and filtering only a low frequency signal, a mixer for converting the filtered analog signal to a transmit carrier frequency, a driver amplifier for controlling a gain of the converted analog signal, and a power amplifier for power-amplifying the analog signal of which the gain is controlled by the driver amplifier. The driver amplifier comprises a plurality of cascode amplifier segments. When a plurality of candidate gain values of the driver amplifier is arranged, the candidate gain values form a geometric sequence.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention provide an apparatus and a method for exponentially controlling a gain of a driver amplifier in a wireless transmitter.

Figure 1:
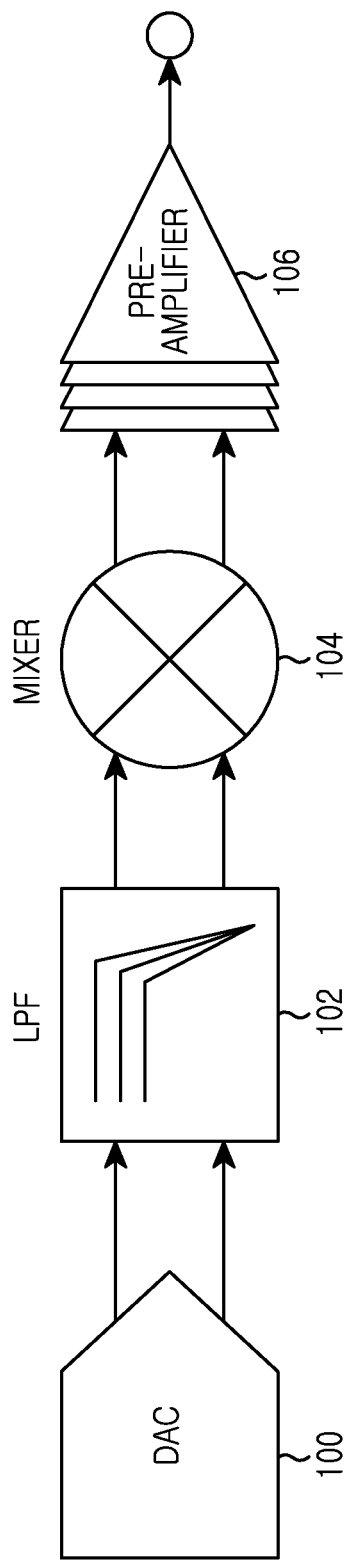
FIG. 1 is a diagram of a wireless transmitter according to an exemplary embodiment of the present invention.
Figure 2:
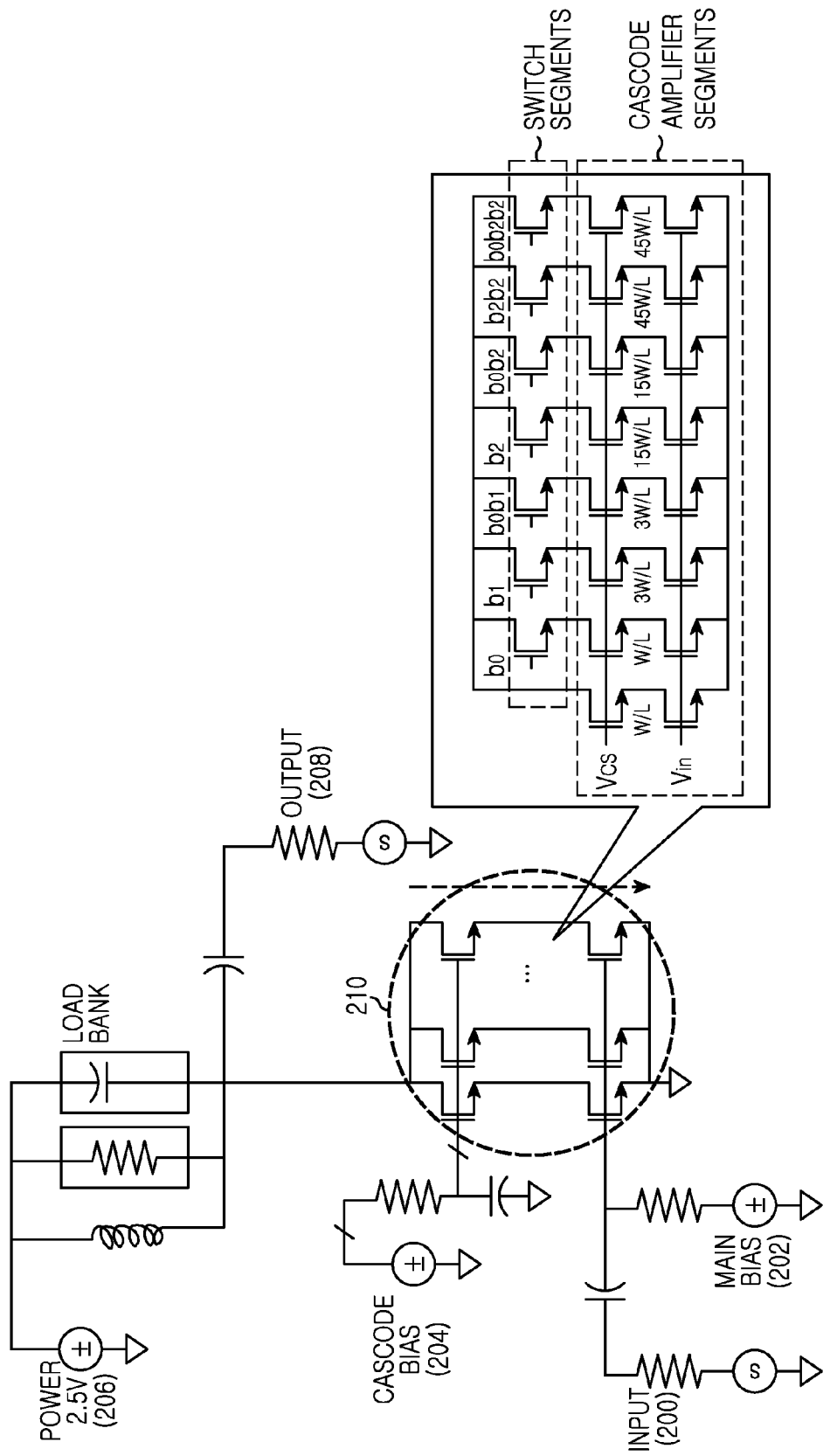
FIG. 2 is a diagram of a driver amplifier according to an exemplary embodiment of the present invention.
Figure 3:
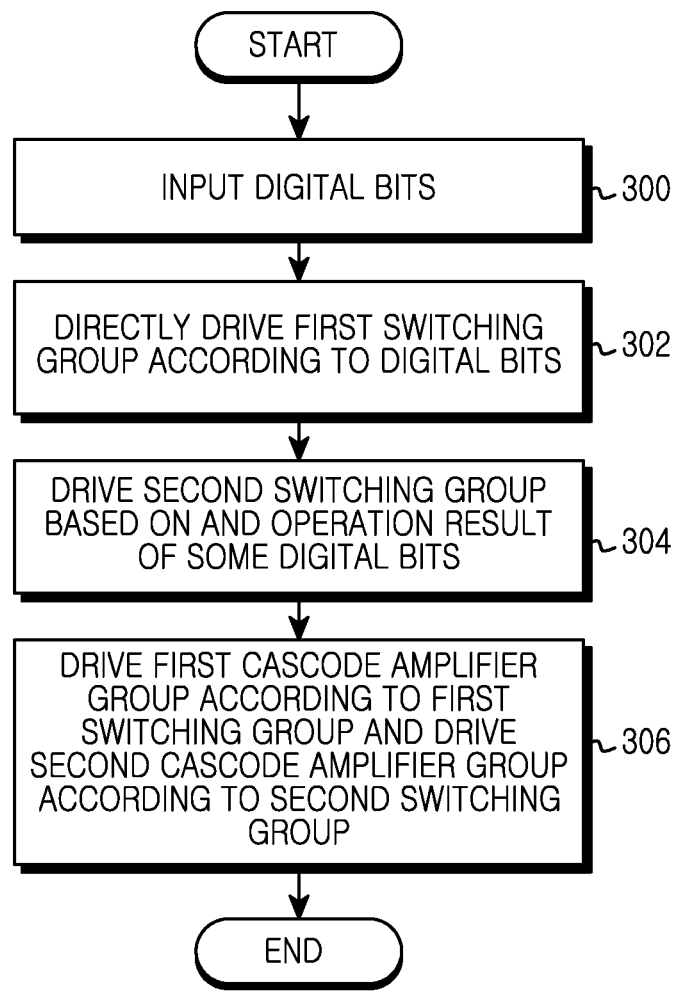
FIG. 3 is a flowchart of a method for exponentially controlling a driver amplifier gain in a wireless transmitter according to an exemplary embodiment of the present invention.

FIGS. 1 through 3, discussed below, and the various exemplary embodiments used to describe the principles of the present disclosure in this patent document are by way of illustration only and should not be construed in any way that would limit the scope of the disclosure. Those skilled in the art will understand that the principles of the present disclosure may be implemented in any suitably arranged communications system. The terms used to describe various embodiments are exemplary. It should be understood that these are provided to merely aid the understanding of the description, and that their use and definitions in no way limit the scope of the invention. Terms first, second, and the like are used to differentiate between objects having the same terminology and are in no way intended to represent a chronological order, unless where explicitly stated otherwise. A set is defined as a non-empty set including at least one element.

FIG. 1 is a diagram of a wireless transmitter according to an exemplary embodiment of the present invention.

Referring to FIG. 1, a Digital to Analog Converter (DAC) 100 converts a digital signal generated by a Transmit Signal Processor (TSP) (not shown) to an analog signal and outputs the analog signal to a Low Pass Filter (LPF) 102.

The LPF 102 removes a high frequency noise, filters only a needed low-frequency signal, and outputs the filtered signal to a mixer 104. The mixer 104 converts a signal output from the LPF 102 to a transmit carrier frequency and outputs the converted signal to a pre-power amplifier 106.

The pre-power amplifier 106 adjusts a gain of the signal output from the mixer 104 and sends the signal to an external power amplifier.

The pre-power amplifier 106, which is single-ended, needs a balun or a differential to single circuit and adjusts the gain using a Radio Frequency Variable Gain Amplifier (RFVGA) in an input stage.

For example, the pre-power amplifier 106 can include the RFVGA, a converter for converting a differential signal to a single-ended signal, and a Driver Amplifier (DA). The DA addresses the lack of gain of the power amplifier and concurrently gives sufficient input power to the power amplifier. Although it is not depicted here, the power amplifier power-amplifies the signal of the compensated gain from the DA and outputs the signal via an antenna The DA is designed based on a maximum output power, and the gain control of the DA needed to obtain a dynamic range of a TX path can variously realize system requirements. For example, when the system requirements demand the maximum output power of 48 dB and the gain control at intervals of 6 dB, eight gain modes in total are adopted. The DA is further explained with reference to FIG. 2.

FIG. 2 is a diagram of a DA according to an exemplary embodiment of the present invention.

Referring to FIG. 2, the DA includes an input stage 200, bias stages 202 and 204, a power supply stage 206, the output stage 208, and a variable gain amplifier 210.

The input stage 200 provides an input signal to a first gate of the variable gain amplifier 210 through an input capacitor, and the power supply stage 206 supplies the power to a drain of the variable gain amplifier 210. In so doing, for the stable power supply, a reactance, a resistor, and an input capacitor are connected in parallel to supply power.

The output stage 208 outputs the signal which is input from the input stage 200 and amplified by the variable gain amplifier 210, through an output resistor.

The main bias stage 202 supplies a bias current or voltage to the first gate of the variable gain amplifier 210, and the cascode bias stage 204 supplies a bias current or voltage to a second gate of the variable gain amplifier 210.

The variable gain amplifier 210 includes therein a plurality of cascode amplifiers, and switches for controlling connection state of the segments.

In this exemplary embodiment, transistor sizes are set to W/L, W/L, 3 W/L, 3 W/L, 15 W/L, 15 W/L, 45 W/L, and 45 W/L to attain the variable gain on 6 dB basis, and a control switch controls seven switches by combining a 3-bit digital signal $b2b1b0$. Accordingly, the largest transistor size is 45 times the smallest transistor size and is reduced to one third of the conventional 128. The total area is 128 times, which is reduced by half the conventional area.

In various exemplary implementations, the size and the number of the transistors, and the digital bits for controlling the switches can vary.

More specifically, exemplary embodiments of the present invention are in a transistor segment structure which can exponentially increase the gain with respect to an N-bit digital code (i.e., N is greater than 2). As an example, operations for controlling the DA gain according to a 3-bit digital control code b0, b1 and b2 are explained below.

When the control code is zero (i.e., b0=0, b1=0, and b2=0), among eight cascode amplifier segments, the cascode amplifier segments excluding the first cascode amplifier segment cut their current and output only the unit current I.

When the input is 1 (i.e., b0=1, b1=0, and b2=0), the switch b0 is turned on, the current flows through the first cascode amplifier segment and the second cascode amplifier segment of the eight cascode amplifier segments, and thus 2 I flows to the output stage.

When the control code is 2 (i.e., b0=0, b1=1, and b2=0), the switch b1 is turned on, the current flows through the first cascode amplifier segment and the third cascode amplifier segment of the eight cascode amplifier segments, and thus 4 I (I+3 I) flows to the output stage.

When the control code is 3 (i.e., b0=1, b1=1, and b2=0), all of b0, b1, and b2 are turned on and I+I+3 I+3 I=8 I flows to the output stage. For example, among the eight cascode amplifier segments, the current flows through the first through fourth cascode amplifier segments and 8 I flows to the output stage.

When the control code is 4 (i.e., b0=0, b1=0, and b2=1), b2 is turned on and I+15 I=16 I flows to the output stage. For example, among the eight cascode amplifier segments, the current flows through the first through fifth cascode amplifier segments and 16 I flows to the output stage.

When the control code is 5 (i.e., b0=1, b1=0, and b2=1), b0 and b2 are turned on to output I+I+15 I+15 I=32 I. For example, among the eight cascode amplifier segments, the current flows through the first, fifth, and sixth cascode amplifier segments and 32 I flows to the output stage.

When the control code is 6 (i.e., b0=0, b1=1, and b2=1), b1 and b2 are turned on to output I+3 I+15 I+45 I=64 I. For example, among the eight cascode amplifier segments, the current flows through the first, third, fifth, and seventh cascode amplifier segments and 64 I flows to the output stage.

When the control code is 7 (i.e., b0=1, b1=1, and b2=1), all of the switches are turned on to output 128 I. For example, the current flows through all of the eight cascode amplifier segments and 128 I flows to the output stage.

As a general expression, when k=4×b2+2×b1+b0, the output current is expanded to a Taylor series. All of b2, b1, and b0 are '1' or zero, b2N=b2, b1N=b1, and b0N=b0. As a result, Equation 1 can be obtained.

$$I_{OUT} = I \times 2^k = I \times 2^{4 \times b2 + 2 \times b1 + b0} \quad (1)$$
$$= I \times (1 + k \cdot \log2 + (k \cdot \log2)^2/2! + (k \cdot \log2)^3/3! + \ldots )$$
$$= (I + I \times b0 + 3I \times b1 + 3I \times b0b1) \times (1 + 15b2)$$

For control at more precise intervals, the Taylor expansion is applied by setting the output as follows. For example, for the control at 3 dB intervals, the segments are constructed by expanding IOUT=I×2 k/2. For the control at 1.5 dB intervals, the segments are constructed by expanding IOUT=I×2 k/4. For example, when the current 6 dB intervals are segmented into M steps, the output current is generalized to Equation 2.

$$I_{OUT} = I \times 2^{k/M} \quad (2)$$

When M is 6, the control is conducted at 1 dB intervals. When M is 6/5, the control at 5 dB intervals is feasible.

FIG. 3 is a flowchart of a method for exponentially controlling a DA gain in a wireless transmitter according to an exemplary embodiment of the present invention.

Referring to FIG. 3, the DA receives the digital bits or the control code in step 300 and directly drives a first switching group according to the digital bits in step 302. For example, in FIG. 2, the switching operations of the switches of the second, third, and fifth cascode amplifier segments are determined directly by the digital bits.

In step 304, the DA drives a second switching group based on an AND operation result of some digital bits. For example, in FIG. 2, the switch of the fourth cascode amplifier segment operates based on the AND operation of the first bit b0 and the second bit b1 of the digital code. The switch of the sixth cascode amplifier segment operates based on the AND operation of the first bit b0 and the third bit b2 of the digital bits. The switch of the seventh cascode amplifier segment operates based on the AND operation of the second bit b1 and the third bit b2 of the digital bits. The switch of the eighth cascode amplifier segment operates based on the AND operation of the first bit b0, the second bit b1, and the third bit b2 of the digital bits.

In step 306, the DA drives a first cascode amplifier segment group according to the first switching group and drives a second cascode amplifier segment group according to the second switching group.

For example, when the digital code is zero in FIG. 2, among the eight cascode amplifier segments, the cascode amplifier segments excluding the first cascode amplifier segment cut their current and output only the unit current I. When the control code is 1 (i.e., b0=1, b1=0, and b2=0), the switch b0 is turned on, the current flows through the first cascode amplifier segment and the second cascode amplifier segment of the eight cascode amplifier segments, and thus 2 I flows to the output stage. When the control code is 2 (i.e., b0=0, b1=1, and b2=0), the switch b1 is turned on, the current flows through the first cascode amplifier segment and the third cascode amplifier segment of the eight cascode amplifier segments, and thus 4 I (i.e., I+3 I) flows to the output stage. When the control code is 3 (i.e., b0=1, b1=1, and b2=0), all of b0, b1, and b2 are turned on, the current flows through the first through fourth cascode amplifier segments among the eight cascode amplifier segments, and 8 I flows to the output stage. When the control code is 4 (i.e., b0=0, b1=0, and b2=1), b2 is turned on, the current flows through the first through fifth cascode amplifier segments among the eight cascode amplifier segments, and 16 I flows to the output stage. When the control code is 5 (i.e., b0=1, b1=0, and b2=1), b0 and b2 are turned on, the current flows through the first, fifth, and sixth cascode amplifier segments among the eight cascode amplifier segments, and 32 I flows to the output stage. When the control code is 6 (i.e., b0=0, b1=1, and b2=1), b1 and b2 are turned on, the current flows through the first, third, fifth, and seventh cascode amplifier segments among the eight cascode amplifier segments, and 64 I flows to the output stage. When the control code is 7 (i.e., b0=1, b1=1, and b2=1), all of the switches are turned on, the current flows through all of the eight cascode amplifier segments, and 128 I flows to the output stage. Thereafter, the DA completes this process.

As set forth above, the control interval of the DA, which was controlled only by multiples of 2, adopts the digital control with the arbitrary linear exponential unit based on dB. Thus, the efficient configuration can reduce the area occupied by the DA by half and reduce the unit cost.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An amplifier comprising:
    a plurality of cascode amplifier segments configured to provide a gain value among candidate gain values for the amplifier,
    wherein the candidate gain values have a substantially exponential distribution,
    wherein at least one of the candidate gain values is provided by a combination of at least two cascode amplifier segments among the plurality of cascode amplifier segments,
    wherein the plurality of the cascode amplifier segments selectively provides the gain value among the candidate gain values based on a control code, and
    wherein the provided gain value is substantially exponentially increased by linearly increasing a value of the control code.

2. The amplifier of claim 1, wherein the plurality of the cascode amplifier segments selectively provides the gain value among the candidate gain values by changing connection states of the cascode amplifier segments.

3. The amplifier of claim 1, further comprising:
a plurality of switch segments configured to determine connection states of the cascode amplifier segments.

4. A transmitter comprising:
a Digital to Analog Converter (DAC) for converting a digital signal to an analog signal; and
an amplifier configured to control a gain of the analog signal,
wherein the amplifier comprises a plurality of cascode amplifier segments configured to provide a gain value among candidate gain values for the amplifier,
wherein the candidate gain values have a substantially exponential distribution,
wherein at least one of the candidate gain values is provided by a combination of at least two cascode amplifier segments among the plurality of cascode amplifier segments,
wherein the plurality of the cascode amplifier segments selectively provides the gain value among the candidate gain values based on a control code, and
wherein the provided gain value is substantially exponentially increased by linearly increasing a value of the control code.

5. The transmitter of claim 4, wherein the plurality of the cascode amplifier segments selectively provides the gain value among the candidate gain values by changing connection states of the cascode amplifier segments.

6. The transmitter of claim 4, wherein the amplifier comprises a plurality of switch segments for determining configured to determine connection states of the cascode amplifier segments.

7. The amplifier of claim 3, wherein at least one of the plurality of switch segments is controlled by a result of an AND operation between bits of the control code.

8. The amplifier of claim 3, wherein each of the switch segments is controlled by a logical operation of at least one bit of the control code.

9. The transmitter of claim 6, wherein at least one of the plurality of switch segments is controlled by a result of an AND operation between bits of the control code.

10. The transmitter of claim 6, wherein each of the switch segments is controlled by a logical operation of at least one bit of the control code.

* * * * *